United States Patent
Buer et al.

[11] Patent Number: 5,808,900
[45] Date of Patent: Sep. 15, 1998

[54] MEMORY HAVING DIRECT STRAP CONNECTION TO POWER SUPPLY

[75] Inventors: Myron Buer, Eden Prairie; Kevin R. LeClair, Prior Lake, both of Minn.; Sudhakar Sabada, Sunnyvale; Mike T. Liang, Milpitas, both of Calif.

[73] Assignee: LSI Logic Corporation, Milpitas, Calif.

[21] Appl. No.: 641,444

[22] Filed: Apr. 30, 1996

[51] Int. Cl.⁶ .................................................. G06F 17/50
[52] U.S. Cl. ........................ 364/491; 364/489; 364/490
[58] Field of Search ................................. 364/489–491; 365/49, 230.06, 230.01, 51; 371/22.31; 257/202, 203

[56] References Cited

U.S. PATENT DOCUMENTS

| | | | |
|---|---|---|---|
| 4,580,228 | 4/1986 | Noto | 364/491 |
| 4,852,016 | 7/1989 | McGehee | 364/491 |
| 4,964,057 | 10/1990 | Yabe | 364/491 |
| 4,978,633 | 12/1990 | Seefeldt et al. | 437/51 |
| 5,040,144 | 8/1991 | Pelley et al. | 365/51 |
| 5,187,864 | 2/1993 | Brasen et al. | 29/846 |
| 5,264,729 | 11/1993 | Rostoker et al. | 257/774 |
| 5,349,542 | 9/1994 | Brasen et al. | 364/578 |
| 5,378,925 | 1/1995 | Sasaki | 257/691 |
| 5,404,310 | 4/1995 | Mitsuhasi | 364/490 |
| 5,477,503 | 12/1995 | Wilson | 365/231 |
| 5,481,469 | 1/1996 | Brasen et al. | 364/483 |
| 5,485,396 | 1/1996 | Brasen et al. | 364/491 |
| 5,502,649 | 3/1996 | Hirata | 364/490 |
| 5,598,348 | 1/1997 | Rusu et al. | 364/491 |

*Primary Examiner*—Emanuel Todd Voeltz
*Assistant Examiner*—Phallaka Kik
*Attorney, Agent, or Firm*—Westman, Champlin & Kelly, P.A.

[57] ABSTRACT

A semiconductor memory layout definition for connection to a power supply bus in an integrated circuit layout pattern. The layout definition includes an outline and a plurality of power supply conductor segments within the outline. At least one of the power supply conductor segments has a direct strap identifier which indicates a desired attachment to the power supply bus. The direct strap identifier is passed to a routing design tool which routes a direct strap conductor from the power supply bus to the power supply conductor segments having the direct strap identifier.

27 Claims, 6 Drawing Sheets

Fig. 6

```
default topocell    (flip false,                                    320
                    angle 0,
                    scale 1.0,
                    offset 0 0);

grid (x 1.400, y 1.400);

technology lcbg10p (type standard_cell, version "0.0", date "XX/XX/XX");
logicell rr001 ()
    {
        topocell rr001 (type ram,
322 ─→      outline -50.400 -18.200 408.800 490.000)
            {
324 ─→      pin $vdd$
                    (free false,
                    type smpin,
                    logical $vdd$,
                    electrical $vdd$,
                    connective n1,
                    resistive n1,
                    location -14.000 -5.600,
                    port input);

<etc>        332        334                         336
326 ─→      wire do3 (type fm-1.200, free false, resistive n22,
                    location 309.400 -9.800, location 309.400 -9.800);
            wire do3 (type sm-0.500, free false, resistive n22,
                    location 309.400 -9.800, location 309.400 0.450);
328 ─→      wire $vss$ (type ckt-dstrap#sm-7.000, free false, resistive n2,
                    location 170.100 486.500, location 174.300 486.500);
330 ─→      wire $vss$ (type sm-11.200, free false, resistive n2,
                    location -43.400 483.000, location 401.800 483.000);
            wire $vss$ (type ckt-dstrap#fm-22.400, free false, resistive n2,
                    location 396.200 -5.600, location 396.200 478.800);

<etc> via $vss$ (type fsmvia, free false, resistive n0,
                    location -43.400 478.200);
            via $vss$ (type fsmvia, free false, resistive n0,
                    location -45.000 487.800);
                <etc> via $vdd$ (type fsmvia, free false, resistive n0,
                    location -24.400 -5.600);
            via $vdd$ (type fsmvia, free false, resistive n0,
                    location -24.400 -7.200);

block (layer sm, outline 0.000 0.000 359.200 462.600,
                    exception no_exception);
            block (layer fm, outline 0.000 0.000 359.200 462.600,
                    exception via_pin_exception);
            block (layer tm, outline 340.100 456.800 341.250 460.000,
                    exception no_exception);
            block (layer tm, outline 343.800 456.800 344.950 460.000,
                    exception no_exception);
            }
    }
```

MEMORY HAVING DIRECT STRAP CONNECTION TO POWER SUPPLY

BACKGROUND OF THE INVENTION

The present invention relates to semiconductor integrated circuits and, more particularly, to a structure and method for connecting a memory to a power supply within the integrated circuit.

Semiconductor integrated circuits are designed and fabricated by first preparing a schematic diagram or hardware description language (HDL) specification of a logical circuit in which functional elements are interconnected to form a logical function. The schematic diagram or HDL specification is then passed to a series of computer-aided design tools which assist the logic designer in converting the schematic diagram or HDL specification to an integrated circuit layout definition which can be fabricated.

The design tools synthesize the schematic diagram or HDL specification into cells of a specific cell library. Each cell corresponds to a logical function unit which is implemented by one or more transistors. Cells having a complex function, such as memories, are referred to as megacells. Each cell or megacell is defined by a cell layout definition, which includes placement, routing and other geometry data of the elements within the cell. During logic synthesis, the design tools generate a netlist from the schematic diagram or HDL specification which lists the selected cells and the interconnections between the cells. A placement tool uses the netlist to place the cells at particular locations on an integrated circuit layout pattern. Once the selected cells have been placed, a routing tool routes the interconnections between the cells along predetermined routing layers. The interconnections include connections from predefined power and ground buses to each cell in the integrated circuit. The placement and routing information is combined with the individual cell layout definitions to form the overall integrated circuit layout definition.

A memory layout definition has a plurality of internal power and ground conductors or "wires" which are to be electrically connected to the predefined power and ground buses of the integrated circuit for distributing power to the transistors and other elements within the memory. Traditional methods for connecting power supply buses to memories tend to consume valuable die area and are relatively inflexible, which limits optimization for particular memory designs. In one method, the memory layout definition includes a pair of internal power and ground rings which surround the memory elements and are coupled to the internal power and ground conductors. After the memory is placed within the integrated circuit layout pattern, the routing tool provides a pair of external power and ground rings around the memory having a width dependent on the width of the internal power and ground rings and then connects the external power and ground rings to each corner of the internal power and ground rings.

This method of connecting power and ground buses to a memory has at least two disadvantages. First, a particular memory design may not require an external power connection at each corner. As a result, the layout pattern includes unnecessary routing connections which congest routing channels and increase die area. Second, the width of the internal memory power and ground rings must be equal to the width of the widest required power connection within the memory to ensure that the memory current level requirements are met. This increases the overall size of the memory and prevents the power and ground connections to be optimized to the particular memory design. There is a continuing need for improved structures and methods for connecting power and ground buses to memories in integrated circuits.

SUMMARY OF THE INVENTION

The semiconductor memory layout definition of the present invention includes an outline and a plurality of power supply conductor segments within the outline. At least one of the power supply conductor segments has a direct strap identifier which indicates a desired attachment at the outline to the power supply bus.

When the memory is placed within an integrated circuit layout pattern, the memory layout definition supplies the direct strap identifier to a routing tool which routes a direct strap conductor from a predefined power supply bus in the layout pattern to the power supply conductor segments in the memory layout definition that have the direct strap identifier. The direct strap identifier therefore eliminates a need for large power supply buses around the entire memory. Only the power supply conductor segments that have the direct strap identifier need to be connected to the power supply bus on the integrated circuit through direct strap conductors. Also, the direct strap identifier allows the memory designer to place power and ground connections in the areas of the memory that have large current requirements. The memory designer therefore has the flexibility to specify the connection locations to the routing tools and thereby reduce the die area required for the memory.

BRIEF DESCRIPTION OF THE DRAWINGS

FIG. 6 is an example of a memory topocell generated in the design process of FIG. 5 according to the present invention.

DETAILED DESCRIPTION OF THE PREFERRED EMBODIMENTS

In the memory layout definition of the present invention, power is distributed through the memory with internal power and ground segments. Selected segments have an associated direct strap identifier which indicates that those segments are to be coupled to an external power or ground bus. The identifiers are fed to the routing tools which attach direct strap conductors between the segments the external power or ground bus.

Figure 1:
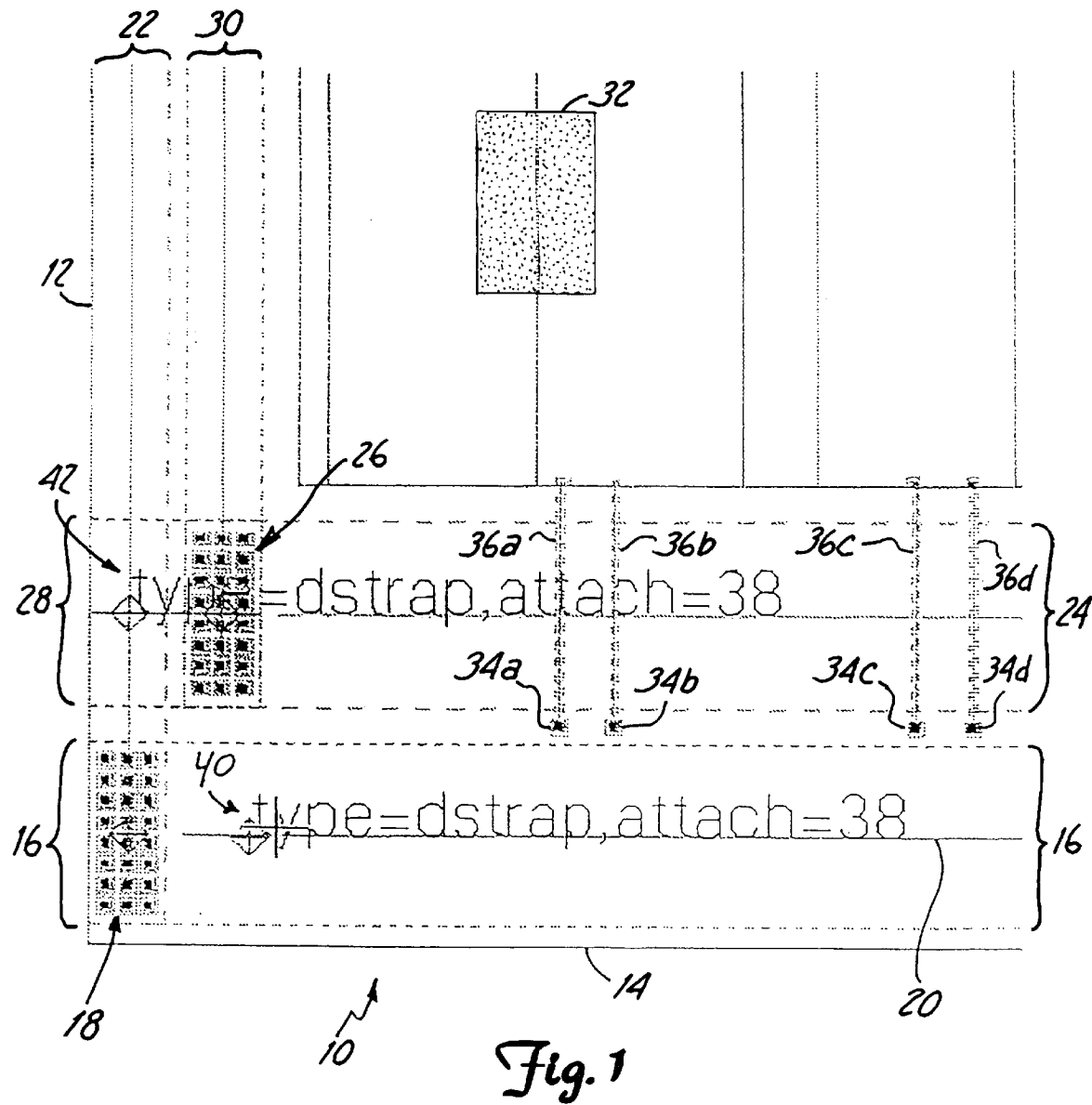
FIG. 1 is a partial graphical representation of a memory having horizontal power and ground segments with direct strap identifiers in accordance with the present invention.

FIG. 1 is a partial graphical representation of a memory layout definition or database having horizontal power and ground segments with direct strap identifiers in accordance with the present invention. Memory 10 is defined by outline edges 12 and 14. Memory 10 is formed by a plurality of transistors (not shown) which are interconnected by dynamic wires. Each dynamic wire is formed by one or more segments of conductive material which extend horizontally or vertically along routing layers of the integrated circuit.

The dynamic wires form conductive paths which interconnect the elements of memory 10 such that the elements perform a desired logical function and which distribute power to the elements of memory 10. For example, power segment 16 extends horizontally from outline edge 12, at via 18, just inside outline edge 14 toward the right-hand side of FIG. 1. The boundary of segment 16 is shown with dashed lines. Power segment 16 has a center 20. Memory 10 has multiple routing layers, including a "metal 1" layer and a "metal 2" layer. Power segment 16 is a metal 2 dynamic wire. Power segment 22 extends vertically from via 18 along outline edge 12. Power segment 22 is a metal 1 dynamic wire. Via 18 provides an electrical conduction path between the metal 1 and metal 2 layers, from power segment 16 to power segment 22. Power segments 16 and 22 supply a voltage VDD to associated elements of memory 10.

Ground segment 24 is a metal 1 dynamic wire which extends horizontally from via 26 toward the right-hand side of FIG. 1. Ground segment 28 is a metal 2 dynamic wire which is electrically coupled to segment 24 through via 26. Ground segment 28 extends horizontally from via 26 to outline edge 12. Ground segment 30 is a metal 2 dynamic wire which extends vertically from via 26. Ground segments 24, 28 and 30 supply a voltage VSS to associated elements of memory 10.

Memory 10 further includes blockage area 32 and input-output (I/O) pins 34a, 34b, 34c and 34d. Blockage area 32 indicates an area on memory 10 in which a dynamic wire cannot be routed. These areas may include areas such as voltage sensitive circuits or areas where a large coupling could cause adverse performance or a possibility of functional problems. Segments 36a, 36b, 36c and 36d are electrically coupled to pins 34a–34d, respectively, and provide a signal path to the internal elements of memory 10.

According to the present invention, a text string is attached to each power and ground segment in the memory layout definition that is to be connected to an external power or ground bus through a direct strap conductor. The text string identifies the segment as having a direct strap type. In one embodiment, only the segments that have the direct strap type identifier and are coincident with the outline edge of the memory are connected to the external power and ground buses.

The text string can have the form "type=dstrap, attach=<layer>" where "dstrap" identifies the segment as a direct strap type dynamic wire and <layer> depends on the layer of the metal on which the segment is routed. For example, power segment 16 includes a text string 40. Text string 40 identifies segment 16 as a direct strap type dynamic wire on layer 38. Layer 38 corresponds to the metal 2 layer. Segment 16 is coincident with outline edge 12. Similarly, segment 28 includes a text string 42. Text string 42 identifies segment 28 as a direct strap type dynamic wire on layer 38. Segment 28 is also coincident with outline edge 12.

When memory 10 is placed within a layout pattern of an integrated circuit such as an application specific integrated circuit (ASIC), the routing tools use the direct strap identifier, the layer identifier and the memory outline to determine where to connect external power and ground buses to the memory. The routing tools then connect a direct strap from the external bus to the intersection between the direct strap type segment and the memory outline. For example, power segment 16 intersects outline edge 12, but does not intersect outline edge 14. The routing tools will therefore attach a direct strap conductor at outline edge 12 along the end of segment 16 but will not attach a direct strap conductor along outline edge 14.

The direct strap conductor preferably has a width equal to the width of the intersection such that the direct strap conductor supplies an appropriate current level to the internal power or ground segment. In a preferred embodiment, the direct strap-type power and ground segments are perpendicular to the outline edge at the intersection, and each segment intersects only non-adjacent edges. This prevents the direct strap conductors from being formed unusually wide.

Figure 2:
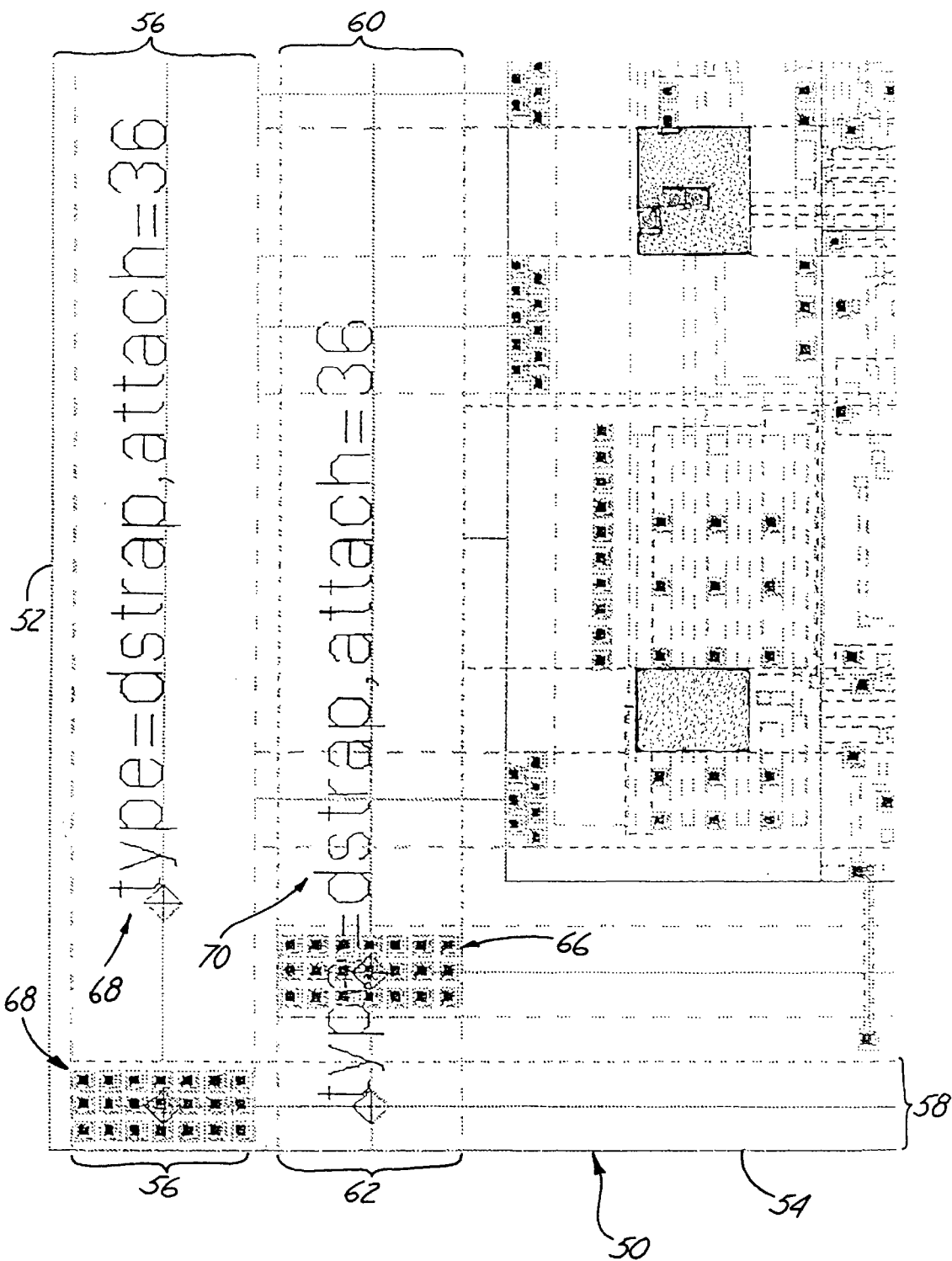
FIG. 2 is a partial graphical representation of a memory having vertical power and ground segments with direct strap identifiers.

FIG. 2 is a partial graphical representation of a memory layout definition in which the direct strap-type power and ground segments run vertically, as opposed to horizontally. Memory 50 includes outline edges 52 and 54, power segments 56 and 58 and ground segments 60 and 62. Power segment 56 is a metal 1 dynamic wire extending vertically from via 64 just inside outline edge 52. Power segment 58 is a metal 2 dynamic wire extending horizontally from via 64 along outline edge 54. Ground segment 60 is a metal 2 dynamic wire extending vertically from via 66. Ground segment 62 is a metal 1 dynamic wire extending vertically from via 66 to outline edge 54. Segments 56 and 62 intersect outline edge 54 and have associated text strings 68 and 70 which identify the segments as being direct strap types and identify the attachment layer as layer 36. Layer 36 corresponds to the metal 1 layer. The routing tools router will therefore route direct strap conductors from the external power and ground buses to the intersections of segments 56 and 62 and outline edge 54. Since segment 56 is not coincident with outline edge 52, the routing tools will not attach a direct strap conductor at outline edge 52.

Figure 3:
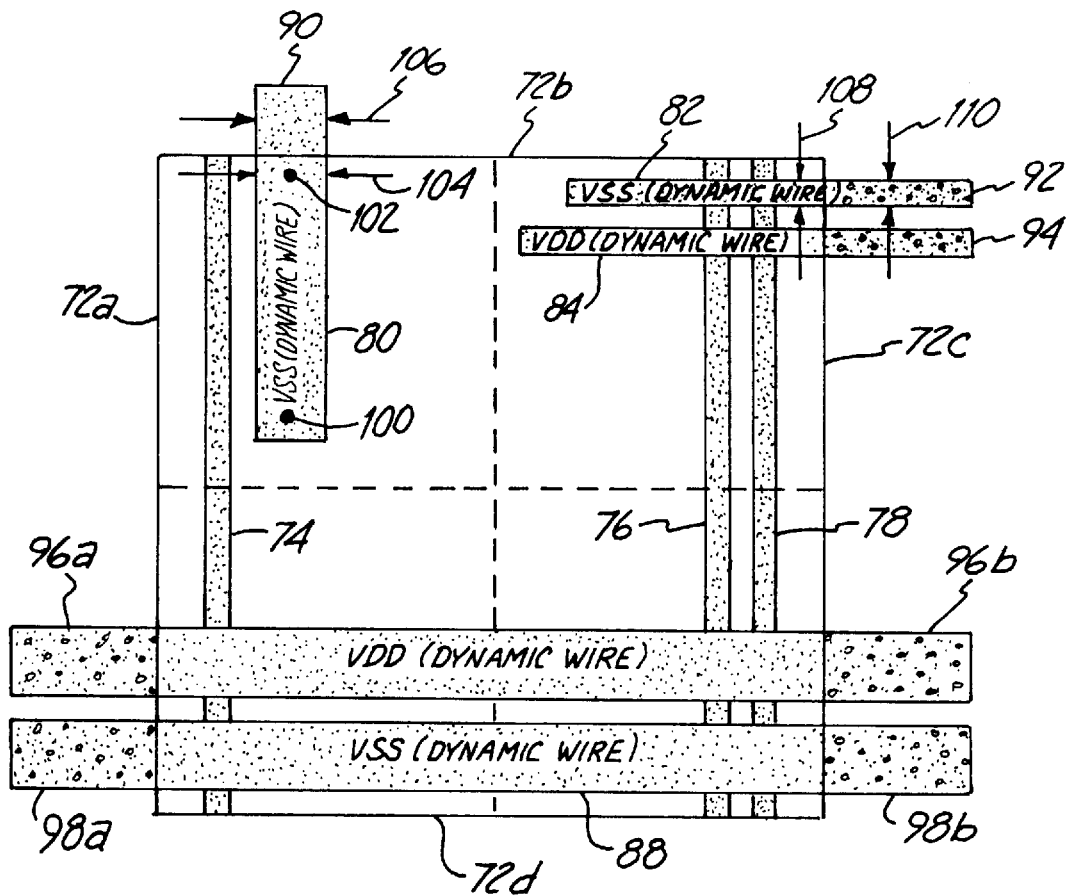
FIGS. 3 and 4 are simplified graphical representations memories having power and ground segments which are attached to direct strap conductors.

FIG. 3 is a simplified graphical representation of a memory having power and ground segments attached to direct strap conductors. Memory 70 includes outline edges 72a–72d and internal power and ground segments 74, 76, 78, 80, 82, 84, 86 and 88. Segments 74, 76 and 78 do not include a direct strap identifier. Therefore, the routing tools have not routed direct strap conductors to these segments. Segments 80, 82, 84, 86 and 88 have direct strap identifiers (not shown) and intersect at least one of the outline edges 72a–72d. The routing tools have therefore routed direct strap conductors 90, 92, 94, 96a, 96b, 98a and 98b to the intersections of segments 80, 82, 84, 86 and 88 and the outline edges.

A conductor segment is typically defined in the memory layout definition by a start coordinate and an end coordinate. For example, ground segment 80 may include a start coordinate 100 and an end coordinate 102. Since start coordinate 100 is internal to and does not intersect with outline edges 72a–72d, it is not attached to a direct strap conductor. End coordinate 102 is substantially coincident with outline edge 72b. Direct strap conductor 90 is thus routed to the intersection of segment 80 and outline edge 72b.

The widths of the direct strap conductors are equal to the widths of the intersections between the internal power and ground segments and the outline edge. For example, the intersection of segment 80 and outline edge 72b has a width 104. Direct strap conductor 90 therefore has a width 106 that is equal to width 104. The intersection of ground segment 82 and outline edge 72c has a width 108. Direct strap conductor 92 therefore has a width 110 that is equal to width 108. Widths 104 and 106 are greater than widths 108 and 110.

Power and ground segments 86 and 88 intersect two non-adjacent edges 72a and 72c of the memory outline and are therefore attached to two direct strap conductors 96a, 96b and 98a, 98b, respectively.

The direct strap identifiers thus provide the memory designer with great flexibility in defining the locations at which the power and ground connections are made. The direct strap method allows the memory designer to place external power and ground connections in the areas of the memory that have large current requirements and to vary the width of the connections accordingly. By allowing the memory designer the flexibility to specify the connection locations to the routing tools, the die area required for the memory megacell can be reduced significantly over methods of the prior art.

Figure 4:
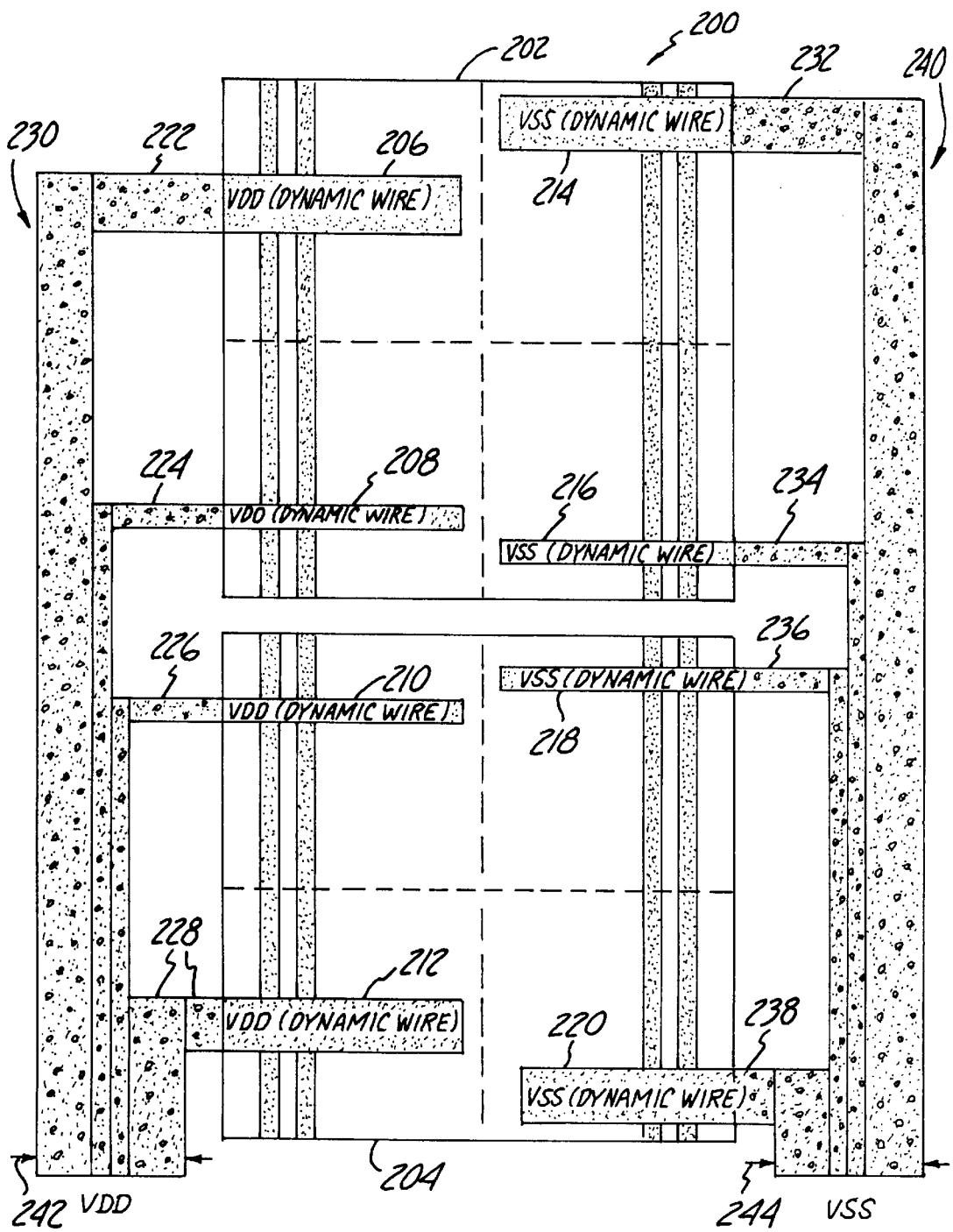

FIG. 4 is a simplified graphical representation of an integrated circuit layout pattern having two memory megacells connected to direct strap conductors, which are merged into single power and ground buses. Integrated circuit layout pattern 200 includes memory megacells 202 and 204. Megacells 202 and 204 include internal power bus segments 206, 208, 210 and 212 and internal ground bus segments 214, 216, 218 and 220 which include direct strap identifiers (not shown). Direct strap conductors 222, 224, 226 and 228 are attached to segments 206, 208, 210 and 212, respectively, and merge into external power bus 230. Direct strap conductors 232, 234, 236 and 238 are attached to segments 214, 216, 218 and 220, respectively, and merge into external ground bus 240. External power bus 230 has a width 242 which is preferably at least as wide as the sum of the widths of the direct strap conductors 222, 224, 226 and 228 that are merged. Similarly, external ground bus 240 has a width 244 which is preferably at least as wide as the sum of the widths of direct strap conductors 232, 234, 236 and 238 that are merged. This provides sufficient current to the internal power and ground bus segments.

Figure 5:
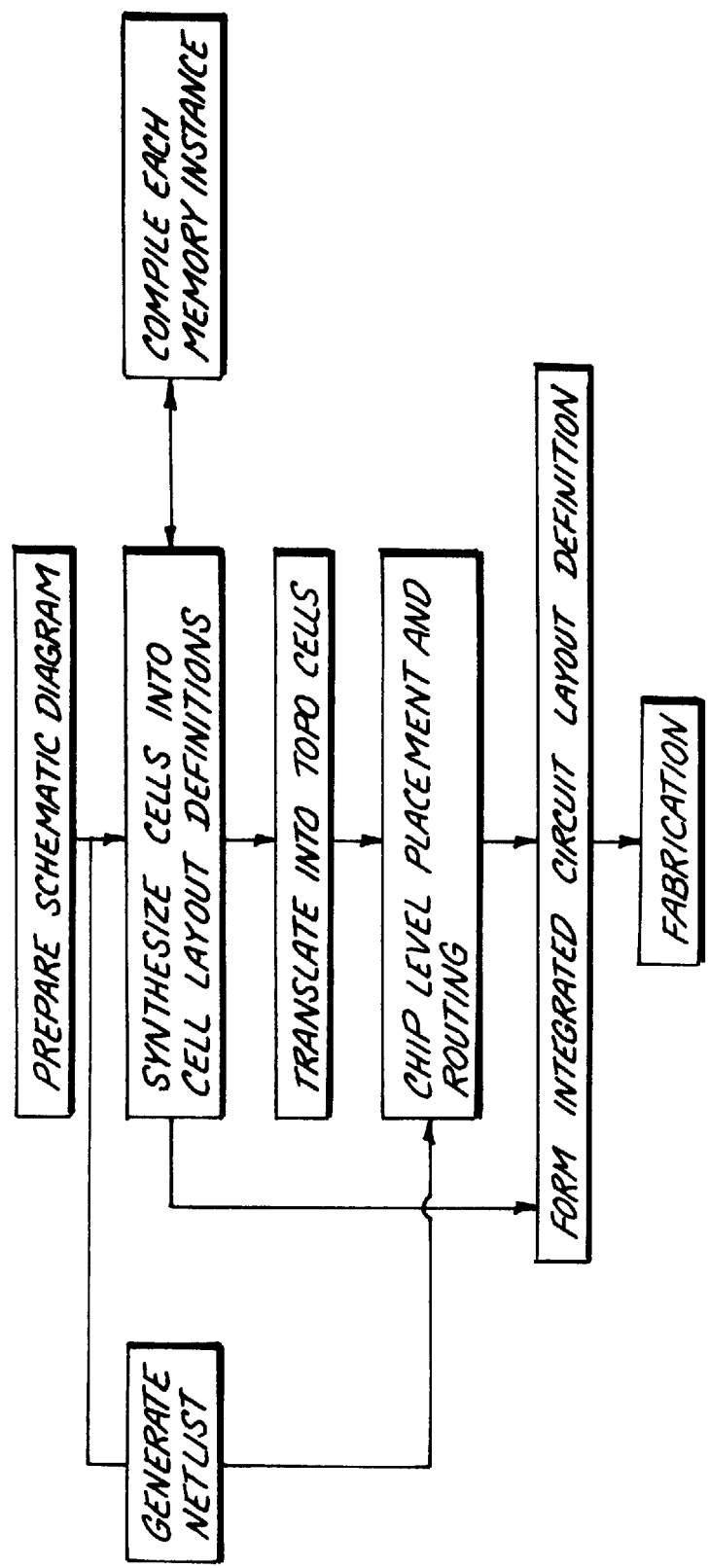
FIG. 5 is a flow-chart illustrating a design process in which the present invention is useful.

FIG. 5 is a flow-chart illustrating a design process in which the present invention is useful. At step 300, the logic designer prepares a schematic diagram or hardware description language (HDL) specification of a logical circuit in which functional elements are interconnected to perform a logical function. The schematic diagram or HDL specification is then passed to a series of computer-aided design tools which assist the logic designer in converting the schematic diagram to an integrated circuit layout definition which can be fabricated. At step 302, a netlist generator generates a netlist. The netlist includes a list of each cell instance in the schematic diagram and the interconnections between the cells. At step 304, a logic synthesizer synthesizes the schematic diagram into cell layout definitions from specific cell library. Each cell layout definition includes a layout pattern of the transistors in the cell, geometry data for the transistors in the cell and cell routing data, for example.

At step 306, a memory compiler compiles a layout definition for each memory instance in the schematic diagram as a function of user options defined by the logic designer, such as the number of words or bits in the memory, and according to the rules defined by the designer of the memory compiler. The memory compiler determines which internal power and ground bus segments will have direct strap identifiers, where the internal power and ground buses will be placed, and the width of the power and ground buses in accordance with the present invention.

At step 308, a topocell generator translates each cell layout definition into a topocell definition. A topocell definition is a simplified version of the cell layout definition and is used for chip level placement and routing, at step 310. A placement and routing tool places the cells within an integrated circuit layout pattern and routes the interconnections between the cells according to the netlist generated at step 302. The chip level placement and routing information is combined with the layout definitions of each cell instance to generate an overall integrated circuit layout definition, at step 312, which can be fabricated at step 314.

FIG. 6 is an example of a memory topocell generated at step 308 according to the present invention. Topocell definition 320 includes a plurality of text strings which define various physical features of the memory. Text string 322 provides outline coordinates which define a physical outline of the semiconductor memory. Text string 324 defines a power supply pin VDD. This pin has a type "smpin", which indicates a second metal (metal 2) pin, and has a location −14.000 −5.600 with respect to a defined origin.

Text strings 326, 328 and 330 define dynamic wires. Each dynamic wire definition includes a wire type 332, a start location 334 and an end location 336. Start location 334 indicates the x and y coordinates of the start of the conductive segment. End location 336 indicates the x and y coordinates of the end of the conductive segment.

Text string 326 defines a dynamic wire having a type "fm-1.200", which indicates a first metal (metal 1) conductive segment having a width of 1.200 microns. Text string 328 defines a dynamic wire for a ground segment VSS having a type "ckt-dstrap#sm-7.000", which indicates a direct strap type ground segment on the second metal layer with a width of 7.000 microns. When memory topocell 320 was generated from the memory layout database for this particular memory instance, the combination of the direct strap annotation in the memory layout database and the metal path of the ground segment results in a "dstrap" wire definition in the memory topocell. If either the start location or the end location are coincident with the physical outline of the memory, the routing tools will attach a direct strap conductor to the outline of the memory at the location of the intersection at the layer and width specified in the dynamic wire definition. Text string 330 defines a dynamic wire for an internal ground segment VSS having a type "sm-11.200", which indicates a ground segment on the second metal layer (metal 2 layer) with a width of 11.200 microns. This ground segment does not have a "dstrap" identifier and will thus not be connected to a direct strap conductor.

In an alternative embodiment, the dynamic wire definitions for the direct strap type power and ground conductor segments further include a current and a voltage identifier field which specifies current and voltage requirements at the connection to that segment. The current and voltage identifiers are passed to the routing tools which adjust the length and width of the direct straps conductors to provide the required current and voltage levels at the connection. The current and voltage identifiers allow the routing tools to compensate for voltage drops along the direct strap conductors due to the resistance of the wire and the distance of the memory from the external power and ground buses.

Although the present invention has been described with reference to preferred embodiments, workers skilled in the art will recognize that changes may be made in form and detail without departing from the spirit and scope of the invention. For example, the direct strap identifiers are not required to have any particular form. The identifiers can simply be associated a particular power and ground conductor segment or segments and be recognizable by one or more computer-aided design tools. The identifiers can be associated with a conductor segment in graphical form, in a database or within the code of a computer program, for example.

What is claimed is:

1. A semiconductor memory layout definition for connection to a power supply bus in an integrated circuit layout pattern, comprising:

outline coordinates which define an outline of the semiconductor memory; and a plurality of power supply dynamic wire definitions, wherein each dynamic wire definition comprises start and end coordinates within the outline and a wire type and wherein the wire type of at least one of the power supply dynamic wire definitions comprises a direct strap identifier which indicates a desired attachment of that power supply dynamic wire to the power supply bus.

2. The semiconductor memory layout definition of claim 1 wherein the power supply dynamic wire definitions that have the direct strap identifier further comprise a current requirement identifier which represents a required current level for the corresponding power supply dynamic wire definition.

3. The semiconductor memory layout definition of claim 1 wherein the power supply dynamic wire definitions that have the direct strap identifier further comprise a voltage requirement identifier which represents a required voltage level for the corresponding power supply dynamic wire definition.

4. The semiconductor memory layout definition of claim 1 wherein at least one of the start and end coordinates of selected power supply dynamic wire definitions that have the direct strap identifier is coincident with the outline.

5. The semiconductor memory layout definition of claim 4 wherein the selected power supply dynamic wire definitions define dynamic wires that intersect the outline in a perpendicular direction only.

6. The semiconductor memory layout definition of claim 1 wherein:
the outline comprises a plurality of edges;
selected power supply dynamic wire definitions that have the direct strap identifier define dynamic wires that intersect the outline at least one edge; and
the edges at which each dynamic wire that intersects the outline are non-adjacent to one another.

7. An integrated circuit layout definition comprising:
a memory cell instance;
a memory layout definition corresponding to the memory cell instance and comprising:
outline coordinates which define an outline of the memory cell instance; and
a plurality of power supply dynamic wire definitions, wherein each dynamic wire definition defines a dynamic wire in the memory cell instance and comprises start and end coordinates within the outline and a wire type, and wherein the wire type of at least one of the power supply dynamic wire definitions comprises a direct strap identifier;
a power supply bus definition which defines a power supply bus; and
a plurality of direct strap conductor definitions, wherein each direct strap conductor definition defines a direct strap conductor that is connected between the power supply bus and a corresponding one of the dynamic wires defined by the power supply dynamic wire definitions that have the direct strap identifier.

8. The integrated circuit layout definition of claim 7 wherein the power supply dynamic wire definitions that have the direct strap identifier further comprise a current requirement identifier which represents a required current level for the corresponding power supply dynamic wire.

9. The integrated circuit layout definition of claim 8 wherein the direct strap conductor definitions define a width and length of the corresponding direct strap conductors, which are functions of the current requirement identifier.

10. The integrated circuit layout definition of claim 7 wherein the power supply dynamic wire definitions that have the direct strap identifier further comprise a voltage requirement identifier which represents a required voltage level for the corresponding power supply dynamic wire.

11. The integrated circuit layout definition of claim 10 wherein the direct strap conductor definitions define a width and length of the corresponding direct strap conductors, which are functions of the voltage requirement identifier.

12. The integrated circuit layout definition of claim 7 wherein at least one of the power supply dynamic wire definitions that have the direct strap identifier defines a power supply dynamic wire which intersects the outline at an intersection and wherein the direct strap conductors are connected between the power supply bus and only the corresponding power supply dynamic wires that intersect the outline.

13. The integrated circuit layout definition of claim 12 wherein the intersection has a width and the direct strap conductor has a width at the outline that is substantially the same as the width of the intersection.

14. The integrated circuit layout definition of claim 7 wherein at least one of the power supply dynamic wire definitions that have the direct strap identifier defines a power supply dynamic wire which intersects the outline perpendicularly and wherein the direct strap conductors are connected between the power supply bus and only the corresponding power dynamic wires that intersect the outline perpendicularly.

15. The integrated circuit layout definition of claim 7 wherein:
the outline has a plurality of edges;
at least one of the power supply dynamic wires intersects more than one edge of the outline which are non-adjacent to one another; and
the direct straps conductors are connected between the power supply bus and only the power supply dynamic wires that intersect non-adjacent edges.

16. The integrated circuit layout definition of claim 7 wherein the power supply dynamic wire definitions which define dynamic wires that are connected to the direct strap conductors have a width identifier and the direct strap conductors have widths that are substantially the same as the widths of the corresponding power supply dynamic wires.

17. The integrated circuit layout definition of claim 7 the plurality of direct strap conductors are merged into the power supply bus, wherein each direct strap conductor has a width and the width of the power supply bus is equal to a sum of the widths of the plurality of direct strap conductors.

18. A method of connecting a power supply bus to a memory cell in an integrated circuit layout pattern, comprising:
placing the memory cell within the layout pattern, the memory cell having a memory layout definition which includes outline coordinates which define an outline of the memory cell and a plurality of power supply dynamic wire definitions which define dynamic wires within the outline, wherein at least one of the dynamic wire definitions has a direct strap identifier;
passing the direct strap identifier from the memory layout definition to a routing tool; and
connecting a direct strap conductor from the power supply bus to the dynamic wires having the direct strap identifier, with the routing tool.

19. The method of claim 18 wherein the power supply dynamic wire definitions include corresponding current requirement identifiers, wherein the step of passing comprises passing the current requirement identifiers to the routing tool and wherein the step of connecting comprises forming the direct strap conductor with a width that is a function of the corresponding current requirement identifier.

20. The method of claim 18 wherein the power supply dynamic wire definitions include corresponding voltage requirement identifiers, wherein the step of passing comprises passing the voltage requirement identifiers to the routing tool and wherein the step of connecting comprises forming the direct strap conductor with a length and width that are functions of the corresponding voltage requirement identifier.

21. The method of claim 18 wherein the step of connecting comprises:

connecting the direct strap conductor to the dynamic wires only if the dynamic wires are perpendicular to the outline.

22. The method of claim 18 wherein:

the outline comprises a plurality of edges;

the dynamic wire definitions having the direct strap identifier define dynamic wires that intersect non-adjacent edges at first and second intersections; and the step of connecting comprises connecting first and second direct strap conductors from the power supply bus to the first and second intersections, respectively.

23. The method of claim 18 wherein the power supply dynamic wire definitions define dynamic wires that intersect the outline at an intersection and have a width at the intersection and wherein the method further comprises:

forming the direct strap conductor with a width that is substantially the same as the width of the intersection.

24. The method of claim 18 and further comprising:

providing the dynamic wire definitions with a width identifier which identifies a width of the dynamic wire;

passing the width identifier to the routing tool; and forming the direct strap conductor with a width that is substantially the same as the width of the corresponding dynamic wire that has the direct strap identifier.

25. The method of claim 18 and further comprising connecting a plurality of direct strap conductors from the power supply bus to the intersections when there are a plurality of dynamic wires having the direct strap identifier; and merging the plurality of direct strap conductors into a common bus having a width that is substantially equal to a sum of the widths of the plurality of direct strap conductors.

26. An integrated circuit layout definition comprising:

a memory cell instance having a memory layout definition which comprises:

means for defining a physical outline of the memory cell instance; and means for defining a plurality of power and ground dynamic wires and for identifying selected dynamic wires as direct strap segments;

a power supply bus; and means for connecting a direct strap conductor between the power supply bus and the direct strap segments.

27. A method of forming a memory layout definition, comprising:

defining a memory outline;

defining a plurality of power supply dynamic wires within the outline, wherein at least one dynamic wire intersects the outline; and associating a direct strap identifier with selected power supply dynamic wires that intersect the outline, wherein the direct strap identifier indicates a desired attachment of the selected power supply dynamic wires to an external power supply bus.

* * * * *